(12) United States Patent
Edwards et al.

(10) Patent No.: US 10,581,153 B2
(45) Date of Patent: Mar. 3, 2020

(54) ELECTRONIC DEVICE ANTENNAS INCLUDING CONDUCTIVE DISPLAY STRUCTURES

(71) Applicant: Apple Inc., Cupertino, CA (US)

(72) Inventors: Jennifer M. Edwards, San Francisco, CA (US); Yijun Zhou, Mountain View, CA (US); Yiren Wang, Santa Clara, CA (US); Hao Xu, Cupertino, CA (US); Ming-Ju Tsai, Sunnyvale, CA (US); Mattia Pascolini, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 132 days.

(21) Appl. No.: 15/701,250

(22) Filed: Sep. 11, 2017

(65) Prior Publication Data

US 2019/0081394 A1  Mar. 14, 2019

(51) Int. Cl.
*H01Q 1/24* (2006.01)
*H01Q 1/48* (2006.01)
(Continued)

(52) U.S. Cl.
CPC .............. *H01Q 1/48* (2013.01); *H01Q 1/243* (2013.01); *H01Q 1/44* (2013.01); *H01Q 9/42* (2013.01);
(Continued)

(58) Field of Classification Search
CPC ............ H01Q 1/48; H01Q 1/24; H01Q 1/243; H01Q 1/44; H01Q 23/00; H01Q 1/38;
(Continued)

(56) References Cited

U.S. PATENT DOCUMENTS 7,136,274 B2  11/2006  Hwang et al.
9,024,823 B2  5/2015  Bevelacqua
(Continued)

FOREIGN PATENT DOCUMENTS

CN  202677015 U  1/2013
CN  103378411 A  10/2013
(Continued)

*Primary Examiner* — Tho G Phan
(74) *Attorney, Agent, or Firm* — Treyz Law Group, P.C.; Joseph F. Guihan

(57) ABSTRACT

An electronic device may be provided with wireless circuitry and control circuitry. The wireless circuitry may include multiple antennas and transceiver circuitry. An antenna in the electronic device may have an inverted-F antenna resonating element formed from portions of a peripheral conductive electronic device housing structure and may have an antenna ground that is separated from the antenna resonating element by a gap. The antenna ground for the antenna may include a conductive frame for the display. The conductive frame may have a first portion that is separated from the antenna resonating element arm by a first distance and a second portion that is separated from the antenna resonating element arm by a second distance that is less than the first distance. The second portion may be configured to form a distributed impedance matching capacitance with the antenna resonating element arm.

13 Claims, 9 Drawing Sheets

(51) Int. Cl.
  *H01Q 1/44* (2006.01)
  *H01Q 23/00* (2006.01)
  *H05K 5/02* (2006.01)
  *H05K 5/00* (2006.01)
  *H04M 1/02* (2006.01)
  *H01Q 9/42* (2006.01)

(52) U.S. Cl.
  CPC .............. *H01Q 23/00* (2013.01); *H04M 1/02* (2013.01); *H04M 1/0266* (2013.01); *H05K 5/0017* (2013.01); *H05K 5/0247* (2013.01)

(58) Field of Classification Search
  CPC .......... H01Q 9/42; H05K 5/00; H05K 5/0017; H05K 5/02; H05K 5/0247; H04B 1/40; H04M 1/02; H04M 1/026; H04M 1/0266
  See application file for complete search history.

(56) References Cited

U.S. PATENT DOCUMENTS

| | | | |
|---|---|---|---|
| 9,041,619 B2 | 5/2015 | McMilin et al. | |
| 9,153,874 B2* | 10/2015 | Ouyang | H01Q 5/321 |
| 9,236,659 B2* | 1/2016 | Vazquez | H01Q 13/103 |
| 9,331,397 B2* | 5/2016 | Jin | H01Q 21/28 |
| 9,537,219 B2* | 1/2017 | Ayala Vazquez | H01Q 9/0442 |
| 9,594,147 B2* | 3/2017 | Han | G01R 29/0878 |
| 9,634,709 B2* | 4/2017 | Hu | H01Q 9/42 |
| 2011/0254741 A1 | 10/2011 | Ishimiya | |
| 2015/0280771 A1 | 10/2015 | Mow et al. | |
| 2015/0311579 A1* | 10/2015 | Irci | H01Q 1/243 343/702 |
| 2016/0072178 A1 | 3/2016 | Khalifa et al. | |
| 2016/0197401 A1 | 7/2016 | Ouyang et al. | |

FOREIGN PATENT DOCUMENTS

| | | |
|---|---|---|
| CN | 104143684 A | 11/2014 |
| CN | 106663159 A | 5/2017 |
| JP | 2002312070 A | 10/2002 |
| JP | 2006013797 A | 1/2006 |
| JP | 2010087752 A | 4/2010 |
| JP | 2017034668 A | 2/2017 |
| KR | 10-2013-0118779 A | 10/2013 |
| KR | 10-2017-0031217 A | 3/2017 |

* cited by examiner

ELECTRONIC DEVICE ANTENNAS INCLUDING CONDUCTIVE DISPLAY STRUCTURES

BACKGROUND

This relates generally to electronic devices and, more particularly, to electronic devices with wireless communications circuitry.

Electronic devices often include wireless communications circuitry. For example, cellular telephones, computers, and other devices often contain antennas and wireless transceivers for supporting wireless communications.

It can be challenging to form electronic device antenna structures with desired attributes. In some wireless devices, antennas are bulky. In other devices, antennas are compact, but are sensitive to the position of the antennas relative to external objects. If care is not taken, antennas may become detuned, may emit wireless signals with a power that is more or less than desired, or may otherwise not perform as expected.

It would therefore be desirable to be able to provide improved wireless circuitry for electronic devices.

SUMMARY

An electronic device may be provided with wireless circuitry and control circuitry. The wireless circuitry may include multiple antennas and transceiver circuitry. The antennas may include antenna structures at opposing first and second ends of the electronic device. The antenna structures at a given end of the device may include adjustable components that are adjusted by the control circuitry to place the antenna structures and the electronic device in one of a number of different operating modes or states.

An antenna in the electronic device may have an inverted-F antenna resonating element formed from portions of a peripheral conductive electronic device housing structure and may have an antenna ground that is separated from the antenna resonating element by a gap. A short circuit path may bridge the gap. An antenna feed may be coupled across the gap in parallel with the short circuit path.

The antenna ground for the antenna may include a conductive frame for the display. The conductive frame may have a first portion that is separated from the antenna resonating element arm by a first distance and a second portion that is separated from the antenna resonating element arm by a second distance that is less than the first distance. The second portion may be configured to form a distributed impedance matching capacitance with the antenna resonating element arm. The antenna feed may have a positive feed terminal coupled to the antenna resonating element arm across from the second portion of the conductive frame.

DETAILED DESCRIPTION

Figure 1:
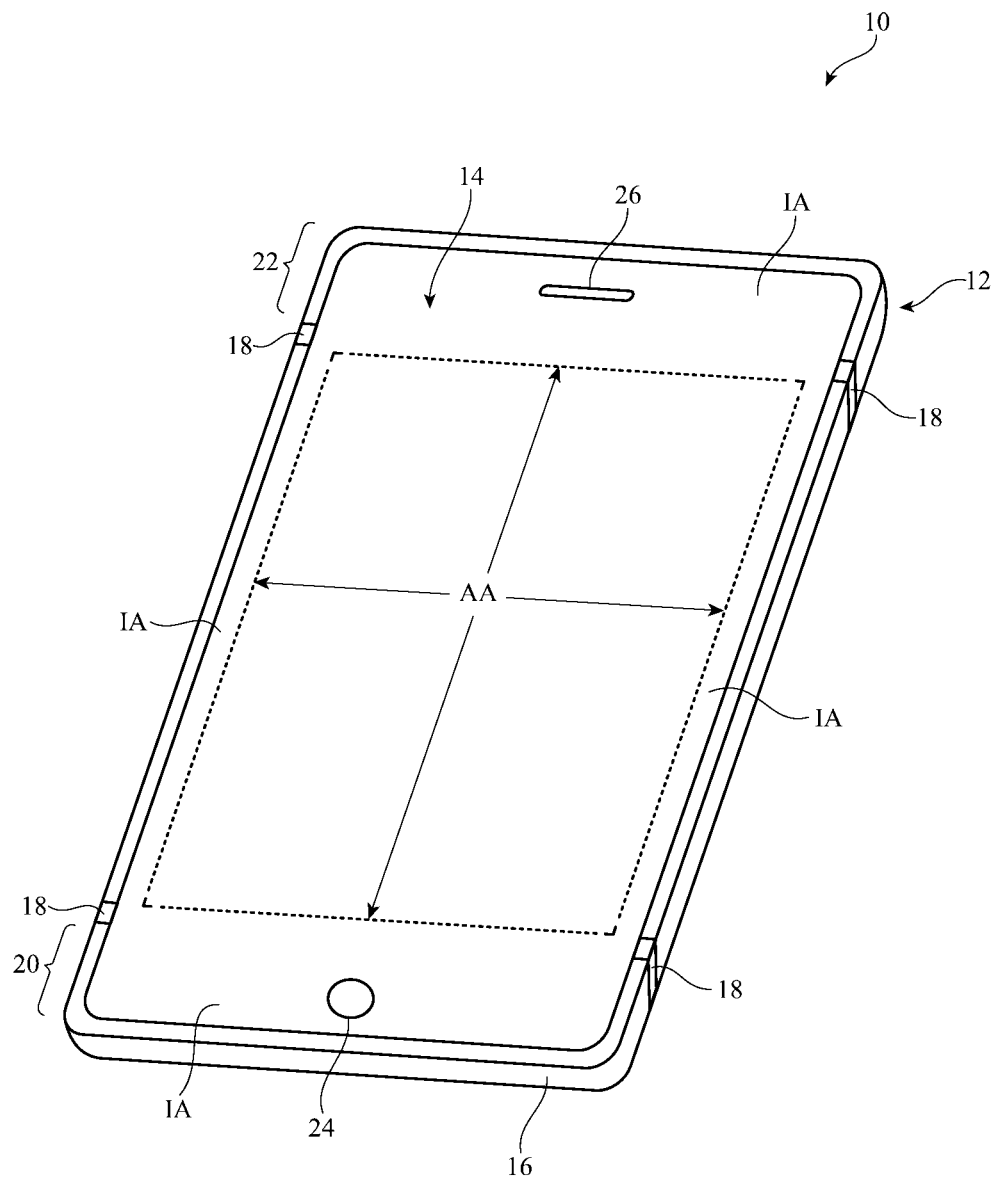
FIG. 1 is a perspective view of an illustrative electronic device in accordance with an embodiment.

Electronic devices such as electronic device 10 of FIG. 1 may be provided with wireless communications circuitry. The wireless communications circuitry may be used to support wireless communications in multiple wireless communications bands.

The wireless communications circuitry may include one more antennas. The antennas of the wireless communications circuitry can include loop antennas, inverted-F antennas, strip antennas, planar inverted-F antennas, slot antennas, hybrid antennas that include antenna structures of more than one type, or other suitable antennas. Conductive structures for the antennas may, if desired, be formed from conductive electronic device structures.

The conductive electronic device structures may include conductive housing structures. The housing structures may include peripheral structures such as peripheral conductive structures that run around the periphery of an electronic device. The peripheral conductive structures may serve as a bezel for a planar structure such as a display, may serve as sidewall structures for a device housing, may have portions that extend upwards from an integral planar rear housing (e.g., to form vertical planar sidewalls or curved sidewalls), and/or may form other housing structures.

Gaps may be formed in the peripheral conductive structures that divide the peripheral conductive structures into peripheral segments. One or more of the segments may be used in forming one or more antennas for electronic device 10. Antennas may also be formed using an antenna ground plane and/or an antenna resonating element formed from conductive housing structures (e.g., internal and/or external structures, support plate structures, etc.).

Electronic device 10 may be a portable electronic device or other suitable electronic device. For example, electronic device 10 may be a laptop computer, a tablet computer, a somewhat smaller device such as a wrist-watch device, pendant device, headphone device, earpiece device, or other wearable or miniature device, a handheld device such as a cellular telephone, a media player, or other small portable device. Device 10 may also be a set-top box, a desktop computer, a display into which a computer or other processing circuitry has been integrated, a display without an integrated computer, or other suitable electronic equipment.

Device 10 may include a housing such as housing 12. Housing 12, which may sometimes be referred to as a case, may be formed of plastic, glass, ceramics, fiber composites, metal (e.g., stainless steel, aluminum, etc.), other suitable materials, or a combination of these materials. In some situations, parts of housing 12 may be formed from dielectric or other low-conductivity material (e.g., glass, ceramic, plastic, sapphire, etc.). In other situations, housing 12 or at least some of the structures that make up housing 12 may be formed from metal elements.

Device 10 may, if desired, have a display such as display 14. Display 14 may be mounted on the front face of device 10. Display 14 may be a touch screen that incorporates capacitive touch electrodes or may be insensitive to touch. The rear face of housing 12 (i.e., the face of device 10 opposing the front face of device 10) may have a planar housing wall. The rear housing wall may have slots that pass entirely through the rear housing wall and that therefore separate housing wall portions (and/or sidewall portions) of housing 12 from each other. The rear housing wall may include conductive portions and/or dielectric portions. If desired, the rear housing wall may include a planar metal layer covered by a thin layer or coating of dielectric such as glass, plastic, sapphire, or ceramic. Housing 12 (e.g., the rear housing wall, sidewalls, etc.) may also have shallow grooves that do not pass entirely through housing 12. The slots and grooves may be filled with plastic or other dielectric. If desired, portions of housing 12 that have been separated from each other (e.g., by a through slot) may be joined by internal conductive structures (e.g., sheet metal or other metal members that bridge the slot).

Display 14 may include pixels formed from light-emitting diodes (LEDs), organic LEDs (OLEDs), plasma cells, electrowetting pixels, electrophoretic pixels, liquid crystal display (LCD) components, or other suitable pixel structures. A display cover layer such as a layer of clear glass or plastic may cover the surface of display 14 or the outermost layer of display 14 may be formed from a color filter layer, thin-film transistor layer, or other display layer. Buttons such as button 24 may pass through openings in the cover layer if desired. The cover layer may also have other openings such as an opening for speaker port 26.

Housing 12 may include peripheral housing structures such as structures 16. Structures 16 may run around the periphery of device 10 and display 14. In configurations in which device 10 and display 14 have a rectangular shape with four edges, structures 16 may be implemented using peripheral housing structures that have a rectangular ring shape with four corresponding edges (as an example). Peripheral structures 16 or part of peripheral structures 16 may serve as a bezel for display 14 (e.g., a cosmetic trim that surrounds all four sides of display 14 and/or that helps hold display 14 to device 10). Peripheral structures 16 may, if desired, form sidewall structures for device 10 (e.g., by forming a metal band with vertical sidewalls, curved sidewalls, etc.).

Peripheral housing structures 16 may be formed of a conductive material such as metal and may therefore sometimes be referred to as peripheral conductive housing structures, conductive housing structures, peripheral metal structures, or a peripheral conductive housing member (as examples). Peripheral housing structures 16 may be formed from a metal such as stainless steel, aluminum, or other suitable materials. One, two, or more than two separate structures may be used in forming peripheral housing structures 16.

It is not necessary for peripheral housing structures 16 to have a uniform cross-section. For example, the top portion of peripheral housing structures 16 may, if desired, have an inwardly protruding lip that helps hold display 14 in place. The bottom portion of peripheral housing structures 16 may also have an enlarged lip (e.g., in the plane of the rear surface of device 10). Peripheral housing structures 16 may have substantially straight vertical sidewalls, may have sidewalls that are curved, or may have other suitable shapes. In some configurations (e.g., when peripheral housing structures 16 serve as a bezel for display 14), peripheral housing structures 16 may run around the lip of housing 12 (i.e., peripheral housing structures 16 may cover only the edge of housing 12 that surrounds display 14 and not the rest of the sidewalls of housing 12).

If desired, housing 12 may have a conductive rear surface or wall. For example, housing 12 may be formed from a metal such as stainless steel or aluminum. The rear surface of housing 12 may lie in a plane that is parallel to display 14. In configurations for device 10 in which the rear surface of housing 12 is formed from metal, it may be desirable to form parts of peripheral conductive housing structures 16 as integral portions of the housing structures forming the rear surface of housing 12. For example, a rear housing wall of device 10 may be formed from a planar metal structure and portions of peripheral housing structures 16 on the sides of housing 12 may be formed as flat or curved vertically extending integral metal portions of the planar metal structure. Housing structures such as these may, if desired, be machined from a block of metal and/or may include multiple metal pieces that are assembled together to form housing 12. The planar rear wall of housing 12 may have one or more, two or more, or three or more portions. Peripheral conductive housing structures 16 and/or the conductive rear wall of housing 12 may form one or more exterior surfaces of device 10 (e.g., surfaces that are visible to a user of device 10) and/or may be implemented using internal structures that do not form exterior surfaces of device 10 (e.g., conductive housing structures that are not visible to a user of device 10 such as conductive structures that are covered with layers such as thin cosmetic layers, protective coatings, and/or other coating layers that may include dielectric materials such as glass, ceramic, plastic, or other structures that form the exterior surfaces of device 10 and/or serve to hide structures 16 from view of the user).

Display 14 may have an array of pixels that form an active area AA that displays images for a user of device 10. An inactive border region such as inactive area IA may run along one or more of the peripheral edges of active area AA.

Display 14 may include conductive structures such as an array of capacitive electrodes for a touch sensor, conductive lines for addressing pixels, driver circuits, etc. Housing 12 may include internal conductive structures such as metal frame members and a planar conductive housing member (sometimes referred to as a backplate) that spans the walls of housing 12 (i.e., a substantially rectangular sheet formed from one or more metal parts that is welded or otherwise connected between opposing sides of member 16). The backplate may form an exterior rear surface of device 10 or may be covered by layers such as thin cosmetic layers, protective coatings, and/or other coatings that may include dielectric materials such as glass, ceramic, plastic, or other structures that form the exterior surfaces of device 10 and/or serve to hide the backplate from view of the user. Device 10 may also include conductive structures such as printed circuit boards, components mounted on printed circuit boards, and other internal conductive structures. These conductive structures, which may be used in forming a ground plane in device 10, may extend under active area AA of display 14, for example.

In regions 22 and 20, openings may be formed within the conductive structures of device 10 (e.g., between peripheral conductive housing structures 16 and opposing conductive ground structures such as conductive portions of housing 12, conductive traces on a printed circuit board, conductive electrical components in display 14, etc.). These openings, which may sometimes be referred to as gaps, may be filled with air, plastic, and/or other dielectrics and may be used in forming slot antenna resonating elements for one or more antennas in device 10, if desired.

Conductive housing structures, conductive display structures, and other conductive structures in device 10 may serve as a ground plane for the antennas in device 10. The openings in regions 20 and 22 may serve as slots in open or closed slot antennas, may serve as a central dielectric region that is surrounded by a conductive path of materials in a loop antenna, may serve as a space that separates an antenna resonating element such as a strip antenna resonating element or an inverted-F antenna resonating element from the ground plane, may contribute to the performance of a parasitic antenna resonating element, or may otherwise serve as part of antenna structures formed in regions 20 and 22. If desired, the ground plane that is under active area AA of display 14 and/or other metal structures in device 10 may have portions that extend into parts of the ends of device 10 (e.g., the ground may extend towards the dielectric-filled openings in regions 20 and 22), thereby narrowing the slots in regions 20 and 22.

In general, device 10 may include any suitable number of antennas (e.g., one or more, two or more, three or more, four or more, etc.). The antennas in device 10 may be located at opposing first and second ends of an elongated device housing (e.g., at ends 20 and 22 of device 10 of FIG. 1), along one or more edges of a device housing, in the center of a device housing, in other suitable locations, or in one or more of these locations. The arrangement of FIG. 1 is merely illustrative.

Portions of peripheral housing structures 16 may be provided with peripheral gap structures. For example, peripheral conductive housing structures 16 may be provided with one or more peripheral gaps such as gaps 18, as shown in FIG. 1. The gaps in peripheral housing structures 16 may be filled with dielectric such as polymer, ceramic, glass, air, other dielectric materials, or combinations of these materials. Gaps 18 may divide peripheral housing structures 16 into one or more peripheral conductive segments. There may be, for example, two peripheral conductive segments in peripheral housing structures 16 (e.g., in an arrangement with two of gaps 18), three peripheral conductive segments (e.g., in an arrangement with three of gaps 18), four peripheral conductive segments (e.g., in an arrangement with four of gaps 18, etc.). The segments of peripheral conductive housing structures 16 that are formed in this way may form parts of antennas in device 10.

If desired, openings in housing 12 such as grooves that extend partway or completely through housing 12 may extend across the width of the rear wall of housing 12 and may penetrate through the rear wall of housing 12 to divide the rear wall into different portions. These grooves may also extend into peripheral housing structures 16 and may form antenna slots, gaps 18, and other structures in device 10. Polymer or other dielectric may fill these grooves and other housing openings. In some situations, housing openings that form antenna slots and other structure may be filled with a dielectric such as air.

In a typical scenario, device 10 may have one or more upper antennas and one or more lower antennas (as an example). An upper antenna may, for example, be formed at the upper end of device 10 in region 22. A lower antenna may, for example, be formed at the lower end of device 10 in region 20. The antennas may be used separately to cover identical communications bands, overlapping communications bands, or separate communications bands. The antennas may be used to implement an antenna diversity scheme or a multiple-input-multiple-output (MIMO) antenna scheme.

Antennas in device 10 may be used to support any communications bands of interest. For example, device 10 may include antenna structures for supporting local area network communications, voice and data cellular telephone communications, global positioning system (GPS) communications or other satellite navigation system communications, Bluetooth® communications, etc.

Figure 2:
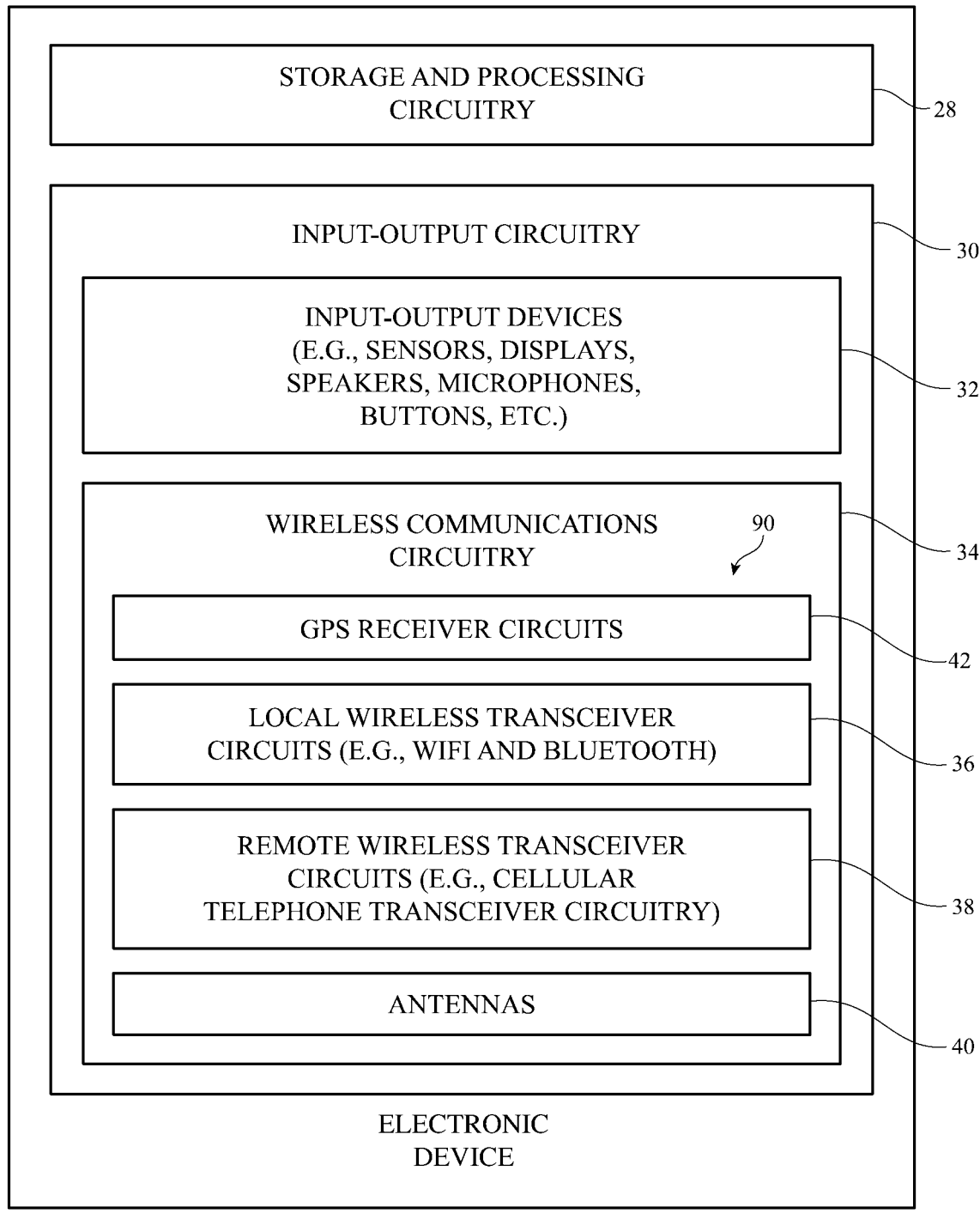
FIG. 2 is a schematic diagram of illustrative circuitry in an electronic device in accordance with an embodiment.

A schematic diagram showing illustrative components that may be used in device 10 of FIG. 1 is shown in FIG. 2. As shown in FIG. 2, device 10 may include control circuitry such as storage and processing circuitry 28. Storage and processing circuitry 28 may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in storage and processing circuitry 28 may be used to control the operation of device 10. This processing circuitry may be based on one or more microprocessors, microcontrollers, digital signal processors, application specific integrated circuits, etc.

Storage and processing circuitry 28 may be used to run software on device 10, such as internet browsing applications, voice-over-internet-protocol (VOIP) telephone call applications, email applications, media playback applications, operating system functions, etc. To support interactions with external equipment, storage and processing circuitry 28 may be used in implementing communications protocols. Communications protocols that may be implemented using storage and processing circuitry 28 include internet protocols, wireless local area network protocols (e.g., IEEE 802.11 protocols—sometimes referred to as WiFi®), protocols for other short-range wireless communications links such as the Bluetooth® protocol, cellular telephone protocols, multiple-input and multiple-output (MIMO) protocols, antenna diversity protocols, etc.

Input-output circuitry 30 may include input-output devices 32. Input-output devices 32 may be used to allow data to be supplied to device 10 and to allow data to be provided from device 10 to external devices. Input-output devices 32 may include user interface devices, data port devices, and other input-output components. For example, input-output devices 32 may include touch screens, displays without touch sensor capabilities, buttons, joysticks, scrolling wheels, touch pads, key pads, keyboards, microphones, cameras, buttons, speakers, status indicators, light sources, audio jacks and other audio port components, digital data port devices, light sensors, position and orientation sensors (e.g., sensors such as accelerometers, gyroscopes, and compasses), capacitance sensors, proximity sensors (e.g., capacitive proximity sensors, light-based proximity sensors, etc.), fingerprint sensors (e.g., a fingerprint sensor integrated with a button such as button 24 of FIG. 1 or a fingerprint sensor that takes the place of button 24), etc.

Input-output circuitry 30 may include wireless communications circuitry 34 for communicating wirelessly with external equipment. Wireless communications circuitry 34 may include radio-frequency (RF) transceiver circuitry formed from one or more integrated circuits, power amplifier circuitry, low-noise input amplifiers, passive RF components, one or more antennas, transmission lines, and other circuitry for handling RF wireless signals. Wireless signals can also be sent using light (e.g., using infrared communications).

Wireless communications circuitry 34 may include radio-frequency transceiver circuitry 90 for handling various radio-frequency communications bands. For example, circuitry 34 may include transceiver circuitry 36, 38, and 42. Transceiver circuitry 36 may handle 2.4 GHz and 5 GHz bands for WiFi® (IEEE 802.11) communications and may handle the 2.4 GHz Bluetooth® communications band. Circuitry 34 may use cellular telephone transceiver circuitry 38 for handling wireless communications in frequency ranges such as a low communications band from 700 to 960 MHz, a low-midband from 960 to 1710 MHz, a midband from 1710 to 2170 MHz, a high band from 2300 to 2700 MHz, an ultra-high band from 3400 to 3700 MHz or other communications bands between 600 MHz and 4000 MHz or other suitable frequencies (as examples).

Circuitry 38 may handle voice data and non-voice data. Wireless communications circuitry 34 can include circuitry for other short-range and long-range wireless links if desired. For example, wireless communications circuitry 34 may include 60 GHz transceiver circuitry, circuitry for receiving television and radio signals, paging system transceivers, near field communications (NFC) circuitry, etc. Wireless communications circuitry 34 may include global positioning system (GPS) receiver equipment such as GPS receiver circuitry 42 for receiving GPS signals at 1575 MHz or for handling other satellite positioning data. In WiFi® and Bluetooth® links and other short-range wireless links, wireless signals are typically used to convey data over tens or hundreds of feet. In cellular telephone links and other long-range links, wireless signals are typically used to convey data over thousands of feet or miles.

Wireless communications circuitry 34 may include antennas 40. Antennas 40 may be formed using any suitable antenna types. For example, antennas 40 may include antennas with resonating elements that are formed from loop antenna structures, patch antenna structures, inverted-F antenna structures, slot antenna structures, planar inverted-F antenna structures, helical antenna structures, dipole antenna structures, monopole antenna structures, hybrids of these designs, etc. Different types of antennas may be used for different bands and combinations of bands. For example, one type of antenna may be used in forming a local wireless link antenna and another type of antenna may be used in forming a remote wireless link antenna.

Figure 3:
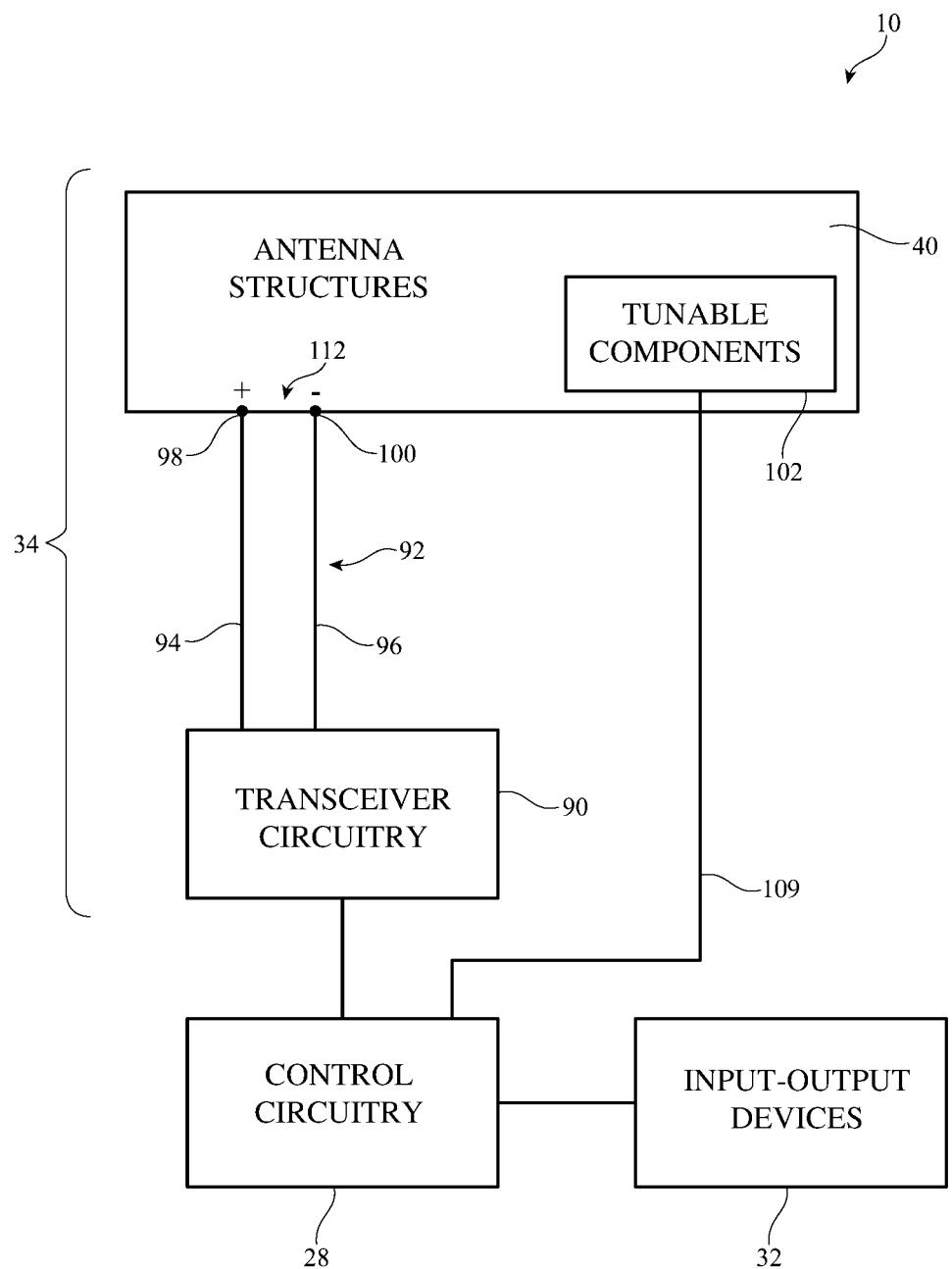
FIG. 3 is a schematic diagram of illustrative wireless communications circuitry in accordance with an embodiment.

As shown in FIG. 3, transceiver circuitry 90 in wireless circuitry 34 may be coupled to antenna structures 40 using paths such as path 92. Wireless circuitry 34 may be coupled to control circuitry 28. Control circuitry 28 may be coupled to input-output devices 32. Input-output devices 32 may supply output from device 10 and may receive input from sources that are external to device 10.

To provide antenna structures such as antenna(s) 40 with the ability to cover communications frequencies of interest, antenna(s) 40 may be provided with circuitry such as filter circuitry (e.g., one or more passive filters and/or one or more tunable filter circuits). Discrete components such as capacitors, inductors, and resistors may be incorporated into the filter circuitry. Capacitive structures, inductive structures, and resistive structures may also be formed from patterned metal structures (e.g., part of an antenna). If desired, antenna(s) 40 may be provided with adjustable circuits such as tunable components 102 to tune antennas over communications bands of interest. Tunable components 102 may be part of a tunable filter or tunable impedance matching network, may be part of an antenna resonating element, may span a gap between an antenna resonating element and antenna ground, etc.

Tunable components 102 may include tunable inductors, tunable capacitors, or other tunable components. Tunable components such as these may be based on switches and networks of fixed components, distributed metal structures that produce associated distributed capacitances and inductances, variable solid state devices for producing variable capacitance and inductance values, tunable filters, or other suitable tunable structures. During operation of device 10, control circuitry 28 may issue control signals on one or more paths such as path 109 that adjust inductance values, capacitance values, or other parameters associated with tunable components 102, thereby tuning antenna structures 40 to cover desired communications bands.

Path 92 may include one or more transmission lines. As an example, signal path 92 of FIG. 3 may be a transmission line having a positive signal conductor such as line 94 and a ground signal conductor such as line 96. Lines 94 and 96 may form parts of a coaxial cable, a stripline transmission line, or a microstrip transmission line (as examples). A matching network (e.g., an adjustable matching network formed using tunable components 102) may include components such as inductors, resistors, and capacitors used in matching the impedance of antenna(s) 40 to the impedance of transmission line 92. Matching network components may be provided as discrete components (e.g., surface mount technology components) or may be formed from housing structures, printed circuit board structures, traces on plastic supports, etc. Components such as these may also be used in forming filter circuitry in antenna(s) 40 and may be tunable and/or fixed components.

Transmission line 92 may be coupled to antenna feed structures associated with antenna structures 40. As an example, antenna structures 40 may form an inverted-F antenna, a slot antenna, a hybrid inverted-F slot antenna or other antenna having an antenna feed 112 with a positive antenna feed terminal such as terminal 98 and a ground antenna feed terminal such as ground antenna feed terminal 100. Positive transmission line conductor 94 may be coupled to positive antenna feed terminal 98 and ground transmission line conductor 96 may be coupled to ground antenna feed terminal 100. Other types of antenna feed arrangements may be used if desired. For example, antenna structures 40 may be fed using multiple feeds. The illustrative feeding configuration of FIG. 3 is merely illustrative.

Control circuitry 28 may use information from a proximity sensor (see, e.g., sensors 32 of FIG. 2), wireless performance metric data such as received signal strength information, device orientation information from an orientation sensor, device motion data from an accelerometer or other motion detecting sensor, information about a usage scenario of device 10, information about whether audio is being played through speaker 26, information from one or more antenna impedance sensors, and/or other information in determining when antenna(s) 40 is being affected by the presence of nearby external objects or is otherwise in need of tuning. In response, control circuitry 28 may adjust an adjustable inductor, adjustable capacitor, switch, or other tunable component 102 to ensure that antenna structures 40 operate as desired. Adjustments to component 102 may also be made to extend the coverage of antenna structures 40 (e.g., to cover desired communications bands that extend over a range of frequencies larger than antenna structures 40 would cover without tuning).

The presence or absence of external objects such as a user's hand may affect antenna loading and therefore antenna performance. Antenna loading may differ depending on the way in which device 10 is being held. For example, antenna loading and therefore antenna performance may be affected in one way when a user is holding device 10 in the user's right hand and may be affected in another way when a user is holding device 10 in the user's left hand. In addition, antenna loading and performance may be affected in one way when a user is holding device 10 to the user's head and in another way when the user is holding device 10 away from the user's head. To accommodate various loading scenarios, device 10 may use sensor data, antenna measurements, information about the usage scenario or operating state of device 10, and/or other data from input-output circuitry 32 to monitor for the presence of antenna loading (e.g., the presence of a user's hand, the user's head, or another external object). Device 10 (e.g., control circuitry 28) may then adjust adjustable components 102 in antenna 40 to compensate for the loading.

Antennas 40 may include slot antenna structures, inverted-F antenna structures (e.g., planar and non-planar inverted-F antenna structures), loop antenna structures, combinations of these, or other antenna structures.

Figure 4:
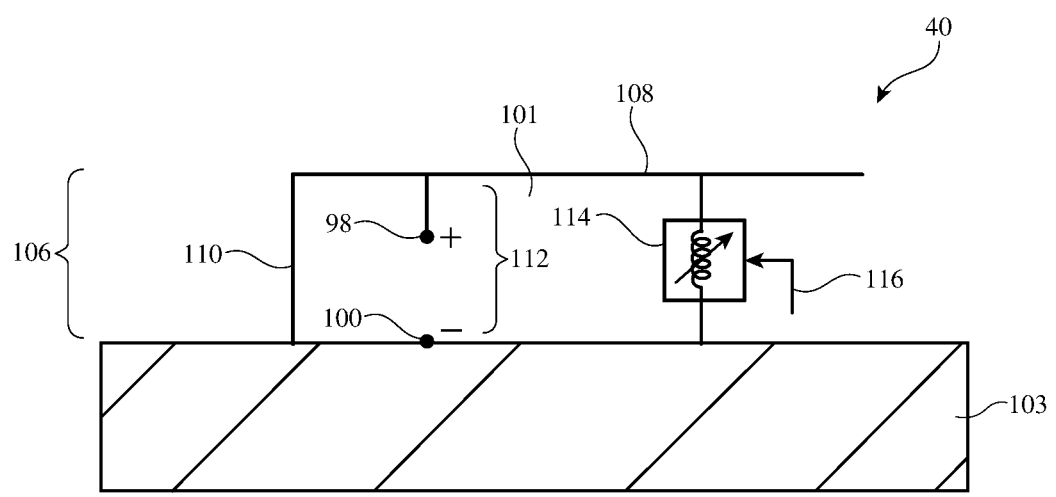
FIG. 4 is a schematic diagram of an illustrative inverted-F antenna in accordance with an embodiment.

An illustrative inverted-F antenna structure is shown in FIG. 4. As shown in FIG. 4, inverted-F antenna structure 40 (sometimes referred to herein as antenna 40 or inverted-F antenna 40) may include an inverted-F antenna resonating element such as antenna resonating element 106 and an antenna ground (ground plane) such as antenna ground 103. Antenna resonating element 106 may have a main resonating element arm such as arm 108. The length of arm 108 may be selected so that antenna structure 40 resonates at desired operating frequencies. For example, the length of arm 108 (or a branch of arm 108) may be a quarter of a wavelength at a desired operating frequency for antenna 40. Antenna structure 40 may also exhibit resonances at harmonic frequencies. If desired, slot antenna structures or other antenna structures may be incorporated into an inverted-F antenna such as antenna 40 of FIG. 4 (e.g., to enhance antenna response in one or more communications bands). As an example, a slot antenna structure may be formed between arm 108 or other portions of resonating element 106 and ground 103. In these scenarios, antenna 40 may include both slot antenna and inverted-F antenna structures and may sometimes be referred to as a hybrid inverted-F and slot antenna.

Arm 108 may be separated from ground 103 by a dielectric-filled opening such as dielectric gap 101. Antenna ground 103 may be formed from housing structures such as a conductive support plate, printed circuit traces, metal portions of electronic components, conductive portions of display 14, and/or other conductive ground structures. Gap 101 may be formed by air, plastic, and/or other dielectric materials.

Main resonating element arm 108 may be coupled to ground 103 by return path 110. Antenna feed 112 may include positive antenna feed terminal 98 and ground antenna feed terminal 100 and may run parallel to return path 110 between arm 108 and ground 103. If desired, inverted-F antenna structures such as illustrative antenna structure 40 of FIG. 4 may have more than one resonating arm branch (e.g., to create multiple frequency resonances to support operations in multiple communications bands) or may have other antenna structures (e.g., parasitic antenna resonating elements, tunable components to support antenna tuning, etc.). Arm 108 may have other shapes and may follow any desired path if desired (e.g., paths having curved and/or straight segments).

If desired, antenna 40 may include one or more adjustable circuits (e.g., tunable components 102 of FIG. 3) that are coupled to antenna resonating element structures 106 such as arm 108. As shown in FIG. 4, for example, tunable components 102 such as adjustable inductor 114 may be coupled between antenna resonating element arm structures in antenna 40 such as arm 108 and antenna ground 103 (i.e., adjustable inductor 114 may bridge gap 101). Adjustable inductor 114 may exhibit an inductance value that is adjusted in response to control signals 116 provided to adjustable inductor 114 from control circuitry 28.

Figure 5:
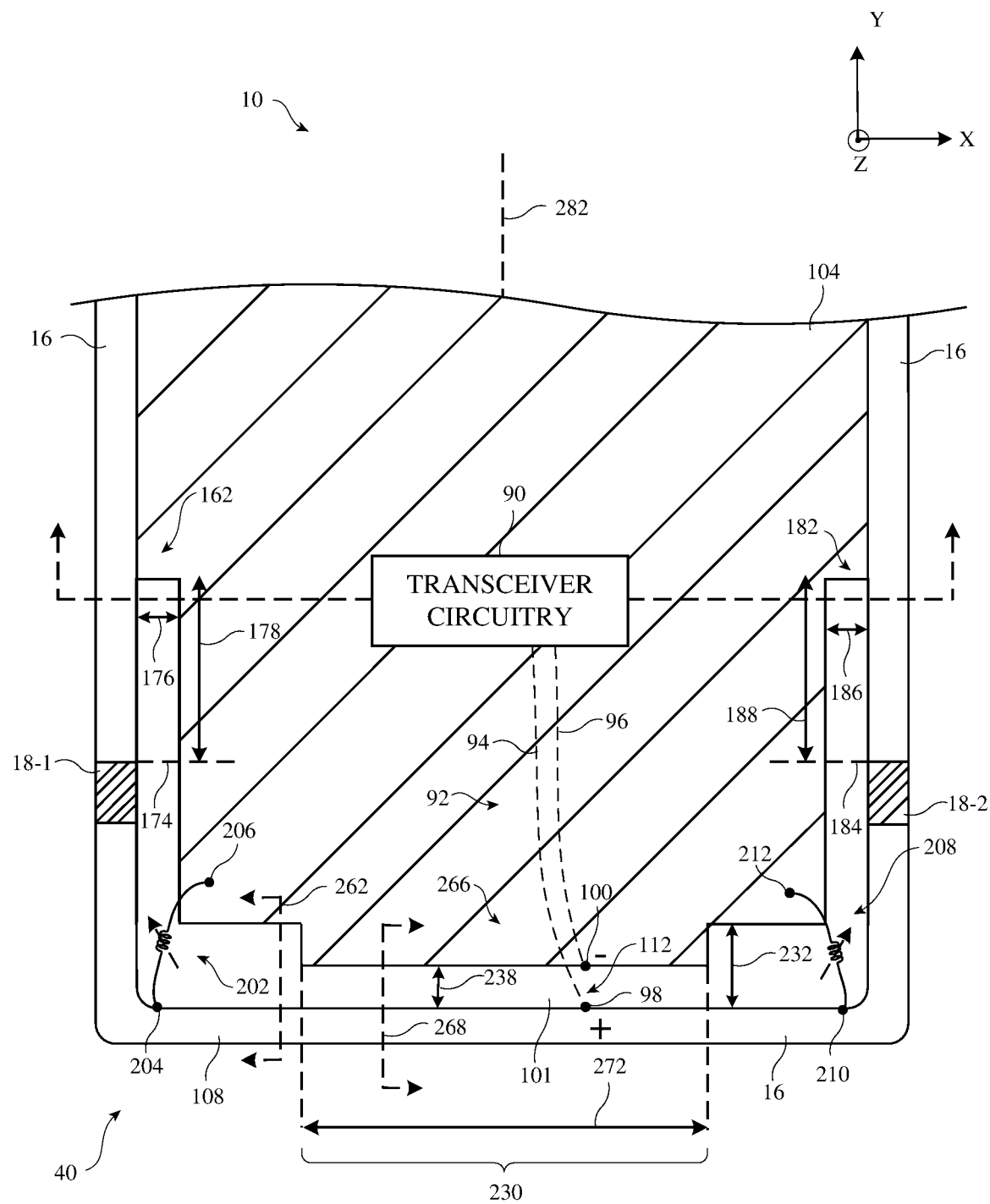
FIG. 5 is a top view of illustrative antenna structures in an electronic device in accordance with an embodiment.

A top interior view of an illustrative portion of device 10 that contains antennas is shown in FIG. 5. As shown in FIG. 5, device 10 may have peripheral conductive housing structures such as peripheral conductive housing structures 16. Peripheral conductive housing structures 16 may be divided by dielectric-filled peripheral gaps (e.g., plastic gaps) 18 such as a first gaps 18-1 and a second gap 18-2. The resonating element for antenna 40 may include an inverted-F antenna resonating element arm such as arm 108 that is formed from a segment of peripheral conductive housing structures 16 extending between gaps 18-1 and 18-2. Air and/or other dielectric may fill slot 101 between arm 108 and display ground structures 104. If desired, opening 101 may be configured to form a slot antenna resonating element structure that contributes to the overall performance of the antenna. Display ground structures 104 may form portions of antenna ground 103 (FIG. 4). Additional portions of the antenna ground may be formed from conductive housing structures, from electrical device components in device 10, from printed circuit board traces, from strips of conductor such as strips of wire and metal foil, or other conductive structures. In one suitable arrangement conductive portions of display 14 (FIG. 1) (e.g., conductive portions of a display panel, a conductive plate for supporting the display panel, and/or a conductive frame for supporting the conductive plate and/or the display panel) form display ground structures 104. Display ground structures 104 may be coupled to conductive portions of housing 12 (e.g., portions of a rear wall of housing 12 and portions of peripheral conductive housing structures 16 that are separated from arm 108 by peripheral gaps 18).

Positive transmission line conductor 94 and ground transmission line conductor 96 of transmission line 92 may be coupled between transceiver circuitry 90 and antenna feed 112. Positive antenna feed terminal 98 of feed 112 may be coupled to arm 108. Ground antenna feed terminal 100 of feed 112 may be coupled to conductive display structures 104. Transceiver circuitry 90 (e.g., remote wireless transceiver circuitry 38, local wireless transceiver circuitry 36, and/or GPS receiver circuitry 42 in FIG. 2) may convey radio-frequency signals in frequency ranges such as a low communications band from 700 to 960 MHz, a low-midband from 960 to 1710 MHz, a midband from 1710 to 2170 MHz, a high band from 2300 to 2700 MHz, an ultra-high band from 3400 to 3700 MHz, 2.4 GHz and 5 GHz bands for WiFi® (IEEE 802.11) communications, and/or a 1575 MHz GPS band using antenna 40 and feed 112.

Antenna feed 112 may be coupled across slot 101 at a location along conductive display structures 104 that is within a distributed capacitance region 230. In the distributed capacitance region, conductive display structures 104 may be separated from peripheral conductive structures 16 by distance 238. The distributed capacitance region 230 may have any desired width 272. Distance 238 and width 272 may, for example, be selected so that a desired distributed capacitance is formed between conductive display structures 104 and peripheral conductive housing structures 16 around feed 112. The distributed capacitance of region 230 may, for example, be directly proportional to width 272 and inversely proportional to distance 238. The distributed capacitance and the corresponding dimensions 272 and 238 may be selected to ensure that antenna 40 is impedance matched to transmission line 92, for example. The distributed capacitance region 230 may therefore sometimes be referred to herein as distributed capacitor 230 (e.g., distributed impedance matching capacitor 230) or distributed capacitance 230 formed from the edge of display ground structures 104 and peripheral conductive structures 16 (e.g., within width 272). The distributed capacitance region 230 may be surrounded along the X-axis of FIG. 5 by two regions where display ground structures 104 are separated from peripheral conductive housing structures 16 by distance 232 that is greater than distance 238, if desired. The portion of display ground structures 104 that are extended to be closer to the peripheral conductive housing structures 16 may sometimes be referred to as ground plane extension 266.

In the example of FIG. 5, antenna feed 112 is coupled across slot 101 at a location along conductive display structures 104 where conductive display structures 104 are separated from peripheral conductive housing structures 16 by distance 238. For example, feed 112 may be coupled across slot 101 within distributed capacitance region 230 such that some the distributed capacitance is formed around feed 112 (e.g., some of the distributed capacitance is located on both sides of the feed). Also in the example of FIG. 5, conductive display structures 104 are separated from peripheral conductive housing structures 16 by a uniform distance 238 in distributed capacitance region 230. These examples are merely illustrative. In general, conductive display structures 104 may be separated from peripheral conductive housing structures 16 by any desired distance(s) in distributed capacitance region 230 to form any desired distributed impedance matching capacitance between display ground structures 104 and peripheral conductive housing structures 16 around feed 112. For example, if desired, display ground structures 104 may be separated from peripheral conductive housing structures 16 by a uniform distance in distributed capacitance region 230 or by two or more different distances in distributed capacitance region 230. In another suitable arrangement, antenna feed 112 may be coupled across slot 101 at other desired locations (e.g., at a location in the distributed capacitance region where display ground structures 104 and peripheral conductive structures 16 are separated by a different distance than distance 238, at a location outside of the distributed capacitance region where display ground structures 104 and peripheral conductive structures 16 are separated by distance 232, etc.). The location of the antenna feed 112 may also be adjusted to further impedance match antenna 40 to transmission line 92.

Including the distributed capacitance in region 230 may allow an additional component such as a surface mount technology capacitor to be omitted, thereby conserving space within the electronic device. Additionally, forming the distributed impedance matching capacitor between peripheral conductive structures 16 and conductive display structures 104 may improve antenna efficiency over a wider range of frequencies than if a surface mount technology capacitor is coupled between peripheral conductive structures 16 and conductive display structures 104.

Conductive display structures 104 may have any desired shape within device 10. For example, a lower edge of conductive display structures 104 may be aligned with gap 18-1 in peripheral conductive hosing structures 16 (e.g., the upper or lower edge of gap 18-1 may be aligned with the edge of conductive display structures 104 defining slot 101 adjacent to gap 18-1). This example is merely illustrative. If desired, as shown in FIG. 5, conductive display structures 104 may include a vertical slot such as slot 162 adjacent to gap 18-1 that extends above the edges of gap 18-1 (e.g., along the Y-axis of FIG. 5). Similarly, the lower edge of conductive display structures 104 may be aligned with the gap 18-2 (e.g., the upper or lower edge of gap 18-2 may be aligned with the edge of conductive display structures 104 defining slot 101 adjacent to gap 18-2) or may extend above the edges of gap 18-2.

As shown in FIG. 5, vertical slot 162 adjacent to gap 18-1 may extend beyond the upper edge (e.g., upper edge 174) of gap 18-1 (e.g., in the direction of the Y-axis of FIG. 5). Slot 162 may, for example, have two edges that are defined by display ground structures 104 and one edge that is defined by peripheral conductive structures 16. Slot 162 may have an open end defined by an open end of slot 101 at gap 18-1. Slot 162 may have a width 176 that separates display ground structures 104 from the portion of peripheral conductive structures 16 above gap 18-1 (e.g., in the direction of the X-axis of FIG. 5). Because the portion of peripheral conductive structures 16 above gap 18-1 is shorted to display ground structures 104 (and thus forms part of the antenna ground for antenna structures 40), slot 162 may effectively form an open slot having three sides defined by the antenna ground for antenna structures 40. Slot 162 may have any desired width (e.g., about 2 mm, less than 4 mm, less than 3 mm, less than 2 mm, less than 1 mm, more than 0.5 mm, more than 1.5 mm, more than 2.5 mm, 1-3 mm, etc.). Slot 162 may have an elongated length 178 (e.g., perpendicular to width 176). Slot 162 may have any desired length (e.g., 10-15 mm, more than 5 mm, more than 10 mm, more than 15 mm, more than 30 mm, less than 30 mm, less than 20 mm, less than 15 mm, less than 10 mm, between 5 and 20 mm, etc.).

Electronic device 10 may be characterized by longitudinal axis 282. Length 178 may extend parallel to longitudinal axis 282 (e.g., the Y-axis of FIG. 5). Portions of slot 162 may contribute slot antenna resonances to antenna 40 in one or more frequency bands if desired. For example, the length and width of slot 162 (e.g., the perimeter of slot 162) may be selected so that antenna 40 resonates at desired operating frequencies. If desired, the overall length of slots 101 and 162 may be selected so that antenna 40 resonates at desired operating frequencies.

If desired, display ground structures 104 may include an additional vertical slot 182 adjacent to gap 18-2 that extends beyond the upper edge (e.g., upper edge 184) of gap 18-2 (e.g., in the direction of the Y-axis of FIG. 5). Slot 182 may, for example, have two edges that are defined by display ground structures 104 and one edge that is defined by peripheral conductive structures 16. Slot 182 may have an open end defined by an open end of slot 101 at gap 18-2. Slot 182 may have a width 186 that separates display ground structures 104 from the portion of peripheral conductive structures 16 above gap 18-1 (e.g., in the direction of the X-axis of FIG. 5). Because the portion of peripheral conductive structures 16 above gap 18-2 is shorted to display ground structures 104 (and thus forms part of the antenna ground for antenna structures 40), slot 182 may effectively form an open slot having three sides defined by the antenna ground for antenna structures 40. Slot 182 may have any desired width (e.g., about 2 mm, less than 4 mm, less than 3 mm, less than 2 mm, less than 1 mm, more than 0.5 mm, more than 1.5 mm, more than 2.5 mm, 1-3 mm, etc.). Slot 182 may have an elongated length 188 (e.g., perpendicular to width 186). Slot 182 may have any desired length (e.g., 10-15 mm, more than 5 mm, more than 10 mm, more than 15 mm, more than 30 mm, less than 30 mm, less than 20 mm, less than 15 mm, less than 10 mm, between 5 and 20 mm, etc.).

Length 188 may extend parallel to longitudinal axis 282 (e.g., the Y-axis of FIG. 5). Portions of slot 182 may contribute slot antenna resonances to antenna 40 in one or more frequency bands if desired. For example, the length and width of slot 182 may be selected so that antenna 40 resonates at desired operating frequencies. If desired, the overall length of slots 101 and 182 may be selected so that antenna 40 resonates at desired operating frequencies. If desired, the overall length of slots 101, 162, and 182 may be selected so that antenna 40 resonates at desired operating frequencies.

A return path such as path 110 of FIG. 4 may be formed by a fixed conductive path bridging slot 101 and/or one or more adjustable components such as adjustable components 202 and/or 208 as shown in FIG. 5 (e.g., adjustable components such as tuning components 102 of FIG. 3). Adjustable components 202 and 208 may sometimes be referred to herein as tuning components, tunable components, tuning circuits, tunable circuits, adjustable components, or adjustable tuning components.

Adjustable component 202 may bridge slot 101 at a first location along slot 101 (e.g., component 202 may be coupled between terminal 206 on display ground structures 104 or another component of antenna ground 103 (FIG. 4) and terminal 204 on peripheral conductive structures 16). Adjustable component 208 may bridge slot 101 at a second location along slot 101 (e.g., component 208 may be coupled between terminal 212 on display ground structures 104 and terminal 210 on peripheral conductive structures 16). Ground antenna feed terminal 100 may be interposed between terminal 206 and terminal 212 on display ground structures 104. Positive antenna feed terminal 98 may be interposed between terminal 204 and terminal 210 on peripheral conductive structures 16. Terminal 212 may be closer to ground antenna feed terminal 100 than terminal 206. Terminal 210 may be closer to positive antenna feed terminal 98 than terminal 204. Terminals 206 and 212 may be formed on portions of display ground structures 104 that are separated from peripheral conductive housing structures 16 by distance 232.

If desired, cutout regions may be included in additional portions of antenna ground 103 (FIG. 4) (e.g., a conductive portion of housing 12) to accommodate additional components (e.g., an additional antenna). In embodiments where the antenna ground includes multiple layers (e.g., both a conductive layer of housing 12 and a conductive ground portions 104), the cutout regions may only be formed in a subset of the layers. For example, the cutout may only be formed in the conductive layer of housing 12 and not in the display ground structures 104.

Components 202 and 208 may include switches coupled to fixed components such as inductors for providing adjustable amounts of inductance or an open circuit between display ground structures 104 and peripheral conductive structures 16. Components 202 and 208 may also include fixed components that are not coupled to switches or a combination of components that are coupled to switches and components that are not coupled to switches. These examples are merely illustrative and, in general, components 202 and 208 may include other components such as adjustable return path switches, switches coupled to capacitors, or any other desired components (e.g., resistors, capacitors, inductors, and/or inductors arranged in any desired manner).

Components 202 and 208 may be adjusted based on the operating environment of the electronic device. For example, a tuning mode for antenna 40 may be selected based on the presence or absence of external objects such as a user's hand or other body part in the vicinity of antenna 40 and/or based on required communication bands. Components 202 and 208 provide antenna 40 with flexibility to accommodate different loading conditions (e.g., different loading conditions that may arise due to the presence of a user's hand or other external object on various different portions of device 10 adjacent to various different corresponding portions of antenna 40).

Components 202 and 208 may be formed between peripheral conductive housing structures 16 and display ground structures 104 using any desired structures. For example, components 202 and 208 may each be formed on a respective printed circuit such as a flexible printed circuit board that is coupled between peripheral conductive housing structures 16 and display ground structures 104.

The frequency response of antenna 40 may be dependent upon the tuning mode of adjustable components 202 and 208. For example, in a first tuning mode, adjustable component 202 may form an open circuit between antenna resonating element arm 108 and display ground structures 104, whereas adjustable component 208 may selectively couple one or more inductors between antenna resonating element arm 108 and display ground structures 104 to tune antenna 40. In the first tuning mode, the resonance of antenna 40 in low band LB (e.g., from 700 MHz to 960 MHz or another suitable frequency range) may be associated with the distance along peripheral conductive structures 16 between feed 112 of FIG. 5 and gap 18-1, for example. FIG. 5 is a view from the front of device 10, so gap 18-1 of FIG. 5 lies on the left edge of device 10 when device 10 is viewed from the front (e.g., the side of device 10 on which display 14 in FIG. 1 is formed) and lies on the right edge of device 10 when device 10 is viewed from behind. The resonance of antenna 40 at midband MB (e.g., from 1710 MHz to 2170 MHz) may be associated with the distance along peripheral conductive structures 16 between feed 112 and gap 18-2, for example. Antenna performance in midband MB may also be supported by slot 182 in display ground structures 104. Antenna performance in high band HB (e.g., 2300 MHz to 2700 MHz) may be supported by slot 162 in display ground structures 104 and/or by a harmonic mode of a resonance supported by antenna arm 108.

In a second tuning mode, adjustable component 208 may form an open circuit between antenna resonating element arm 108 and display ground structures 104 to tune the antenna, whereas adjustable component 202 may selectively couple one or more inductors between antenna resonating element arm 108 and display ground structures 104 to tune antenna 40. In the second tuning mode, the resonance of antenna 40 in low band LB may be associated with the distance along peripheral conductive structures 16 between the position of component 202 (i.e., terminal 204) of FIG. 5 and gap 18-2, for example. The resonance of antenna 40 in midband MB may be associated with the distance along peripheral conductive structures 16 between the position of component 202 (i.e., terminal 204) and gap 18-1, for example. Antenna performance in high band HB may also be supported by slot 162 in display ground structures 104.

In a third tuning mode, adjustable components 202 and 208 may both selectively couple one or more inductors between antenna resonating element arm 108 and display ground structures 104 to tune antenna 40. In the third tuning mode, the resonance of antenna 40 at midband MB and high band HB may be associated with a loop including portions of peripheral conductive structures 16 (e.g., the portion of peripheral conductive structures 16 between terminal 204 of component 202 and terminal 210 of component 208) component 202, display ground structures 104, and component 208.

Antennas 40 may be configured to handle different frequency bands in each tuning mode. For example, in the first tuning mode, antenna 40 may be configured to perform communications in a low band, midband, and high band. In the second tuning mode of antenna 40 may also be configured to perform communications in the low band, midband, and high band. However, the first and second tuning modes may compensate for antenna loading by an external device such as a user's hand in different ways. For example, in the first tuning mode, antenna 40 may be configured to operate with a relatively high antenna efficiency if device 10 is being held by a user's right hand and a relatively low antenna efficiency if device 10 is being held by a user's left hand, whereas in the second tuning mode antenna 40 may be configured to operate with a relatively high antenna efficiency if device 10 is being held by a user's left hand and a relatively low antenna efficiency if device 10 is being held by a user's right hand. In other words, in the first and second tuning modes, antenna 40 may perform wireless communications in the low band, midband, and high band, but may be sensitive to certain operating conditions such as which hand a user is using to hold device 10.

In general, antenna 40 may be more susceptible to changing loading conditions and detuning when operating in the low band than when operating in the midband or high band. In the third tuning mode, antenna 40 may be configured to operate with a relatively high efficiency regardless of which hand a user is using to hold device 10 (e.g., antenna 40 may be resilient or reversible to the handedness of the user). However, when placed in the third tuning mode, antenna 40 may only cover a subset of the frequency bands that antenna 40 is capable of covering in the first and second tuning modes. For example, in the third tuning mode antenna 40 may cover the midband and high band without covering the low band.

Figure 6:
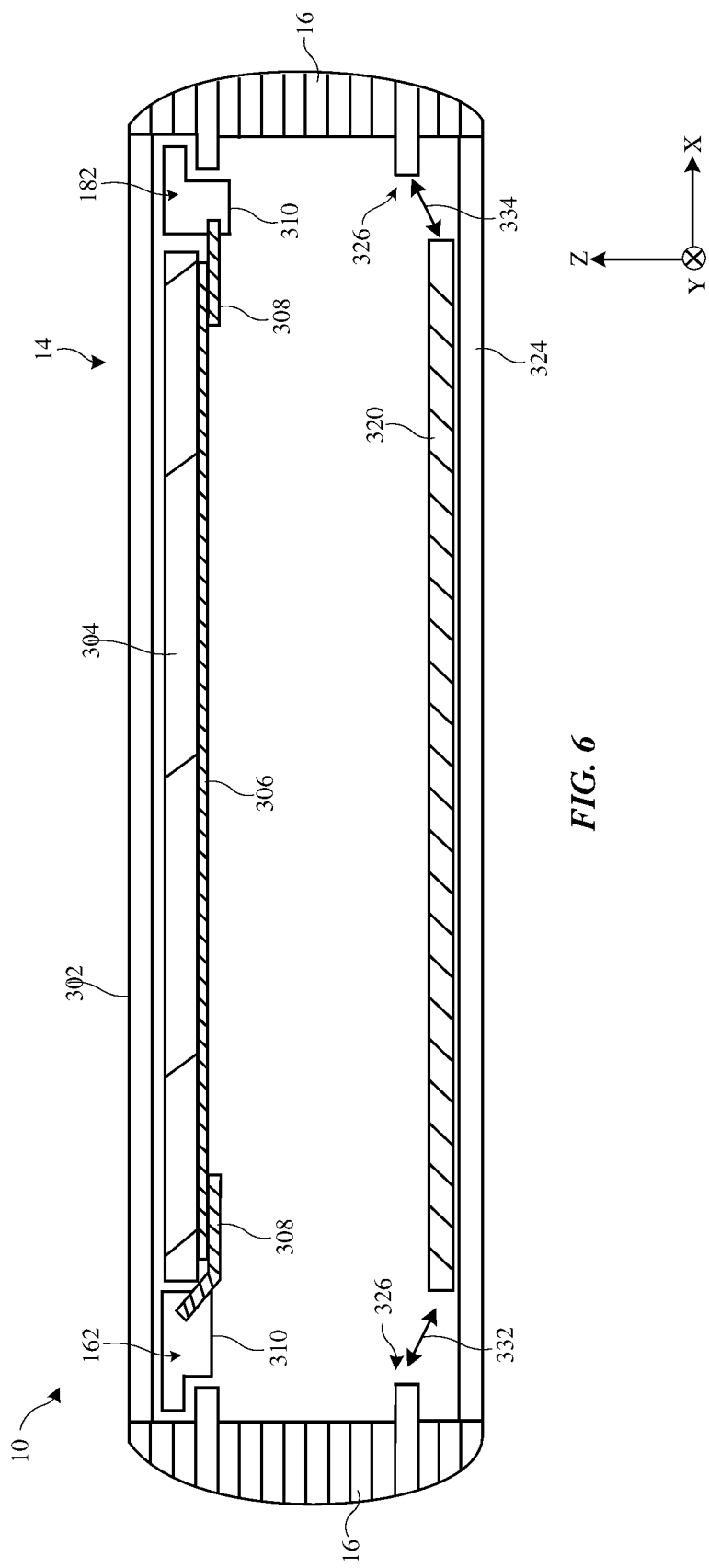
FIG. 6 is a cross-sectional side view of an illustrative electronic device showing how vertical slots of the type shown in FIG. 5 may be formed in accordance with an embodiment.

FIG. 6 is a cross-sectional side view of electronic device 10 (e.g., as taken along line 260 in FIG. 5). As shown in FIG. 6, display 14 for electronic device 10 may include a display cover layer such as display cover layer 302 that covers display panel 304. Display panel 304 (sometimes referred to as a display module) may be any desired type of display panel and may include pixels formed from light-emitting diodes (LEDs), organic LEDs (OLEDs), plasma cells, electrowetting pixels, electrophoretic pixels, liquid crystal display (LCD) components, or other suitable pixel structures. The lateral area of display panel 304 may, for example, determine the size of active area AA (FIG. 1) of display 14. Display panel 304 may include active light emitting components, touch sensor components (e.g., touch sensor electrodes), force sensor components, and/or other active components. Display cover layer 302 may be a layer of clear glass, plastic, or other dielectric that covers the light-emitting surface of the underlying display panel. In another suitable arrangement, display cover layer 302 may be the outermost layer of display panel 304 (e.g., layer 302 may be a color filter layer, thin-film transistor layer, or other display layer). Buttons may pass through openings in cover layer 302 (see button 24 in FIG. 1). The cover layer may also have other openings such as an opening for a speaker port (see speaker port 26 in FIG. 1), openings for a sensor (e.g., sensor 248), or openings for any other desired electronic component.

Display panel 304 may be supported within electronic device 10 by a conductive display support plate (sometimes referred to as a midplate or display plate) such as display plate 306. Conductive display frame 308 may hold display plate 306 and/or display panel 304 in place on housing 12. For example, display frame 308 may be ring-shaped and may include a portion that runs around the periphery of the display panel 304 and surrounds a central opening. Display plate 306 and display frame 308 may both be formed from conductive material (e.g., metal). Display plate 306 and display frame 308 may be in direct contact such that the display plate 306 and the display frame 308 are electrically connected. If desired, display plate 306 and display frame 308 may be formed integrally (e.g., from the same piece of metal). The arrangement of FIG. 6 may allow for the inactive area IA (FIG. 1) of display 14 to be very thin.

A plastic frame 310 may be molded around display frame 308. Plastic frame 310 may also be ring-shaped (similar to display frame 308). Electronic device 10 may have a rectangular periphery with upper and lower edges coupled together by left and right edges. Plastic frame 310 may run around the rectangular periphery of electronic device 10. Plastic frame 310 may be formed from molded plastic or any other desired dielectric material and may serve to mount frame 308 and thus plate 306 and panel 304 to peripheral conductive housing structures 16. Conductive frame 308, conductive plate 306, and conductive portions of panel 304 (e.g., conductive electrodes, pixel circuitry, ground layers, ferrite layers, shielding layers, etc.) may form display ground structures 104 for antenna 40 (FIG. 5).

Peripheral conductive housing structure 16 may have integral ledge portions 326. Integral ledge portions 326 may extend away from peripheral conductive housing structure 16 towards the interior of electronic device 10. Integral ledge portions 326 may be used to mount various components within electronic device 10 if desired. For example, in one illustrative embodiment plastic frame 310 may be supported by a ledge portion 326 of peripheral conductive housing structure 16.

As shown in FIG. 6, housing 12 (FIG. 1) may include dielectric housing portions such as dielectric layer 324 and conductive housing portions such as conductive layer 320 (sometimes referred to herein as conductive housing wall 320). If desired, dielectric layer 324 may by formed under layer 320 such that layer 324 forms an exterior surface of device 10 (e.g., thereby protecting layer 320 from wear and/or hiding layer 320 from view of a user). Conductive housing portion 320 may be electrically connected to the display ground structures. As examples, conductive housing portion 320 may be a conductive support plate or wall (e.g., a conductive back plate or rear housing wall) for device 10. Conductive housing portion 320 may, if desired, extend across the width of device 10 (e.g., between two opposing sidewalls formed by peripheral housing structures 16). If desired, conductive housing portion 320 and the opposing sidewalls of device 10 may be formed from a single integral piece of metal or portion 320 may otherwise be shorted to the opposing sidewalls of device 10. Dielectric layer 324 may be a thin glass, sapphire, ceramic, or sapphire layer or other dielectric coating, as examples. In another suitable arrangement, layer 324 may be omitted if desired.

At each ground terminal within the device (e.g., terminals 206, 212, 100 in FIG. 5), different components of the device ground may be electrically connected so that the conductive structures (e.g., conductive display structures 104 in FIG. 5) that are located closest to a resonating element arm portion of peripheral conductive structures 16 are held at a ground potential and form a part of antenna ground 103 (FIG. 4). In one suitable arrangement, the antenna ground includes both display ground structures (e.g., conductive portions of display panel 304, conductive plate 306, and/or conductive frame 308) and conductive portions of housing 12 (e.g., portions of a rear wall of housing 12 such as a conductive backplate 320 and portions of peripheral conductive housing structures 16 that are separated from arm 108 by peripheral gaps 18). Vertical conductive structures (e.g., a bracket, clip, spring, pin, screw, solder, weld, conductive adhesive, wire, metal strip, or a combination of these) may couple conductive portions of housing 12 (e.g., a conductive backplate) to display ground structures 104 at terminals 206, 212, and/or 100 in FIG. 5. Ensuring that the conductive structures close to resonating element arm 108 (FIG. 5) such as conductive display structures are held at a ground potential may, for example, serve to optimize the antenna efficiency of antenna structures 40. In one suitable arrangement, ground terminals 206, 212, and/or 100 (FIG. 5) may include a conductive structure such as a spring that electrically connects the conductive backplate to conductive display structures.

As shown in FIG. 6, slot 162 may be formed between peripheral conductive housing structures 16 and conductive frame 308 (which forms a portion of display ground structures 104). Similarly, slot 182 may be formed between peripheral conductive housing structures 16 and conductive frame 308. In this example, width 176 (FIG. 5) of slot 162 is defined by the distance between conductive frame 308 and peripheral conductive housing structures 16 (e.g., on a side of the electronic device adjacent to dielectric-filled gap 18-1). Width 186 (FIG. 5) of slot 182 is defined by the distance between conductive frame 308 and peripheral conductive housing structures 16 (e.g., on a side of the electronic device adjacent to dielectric-filled gap 18-2). Conductive housing layer 320 may also form a portion of antenna ground 103 (FIG. 4). Beneath slot 162, conductive housing layer 320 may be separated from peripheral conductive housing structures 16 by a distance 332 that is greater than or equal to the width of slot 162. Beneath slot 182, conductive housing layer 320 may be separated from peripheral conductive housing structures 16 by a distance 334 that is greater than or equal to the width of slot 182. The example of FIG. 6 is merely illustrative, and other arrangements may be used to form slots 162 and 182 in display ground structures 104.

Figure 7:
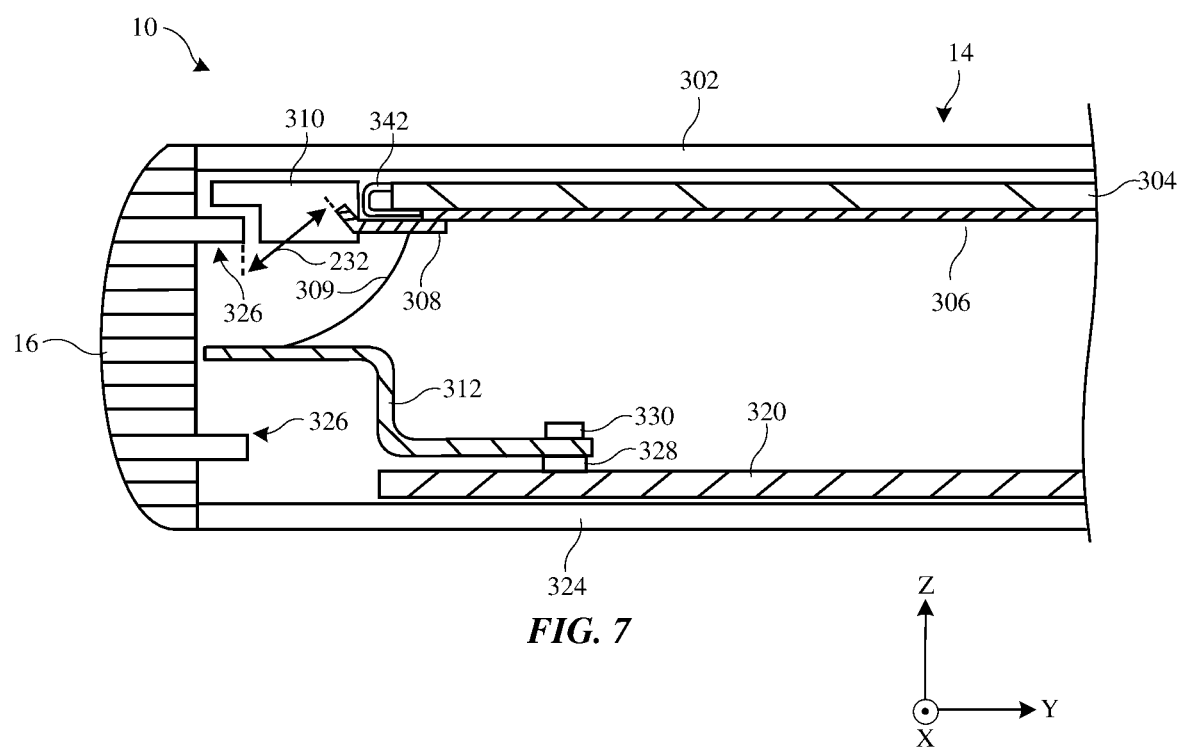
FIGS. 7 and 8 are cross-sectional side views of an illustrative electronic device showing how a distributed capacitance of the type shown in FIG. 5 may be formed between display ground structures and an antenna resonating element in accordance with an embodiment.
Figure 8:
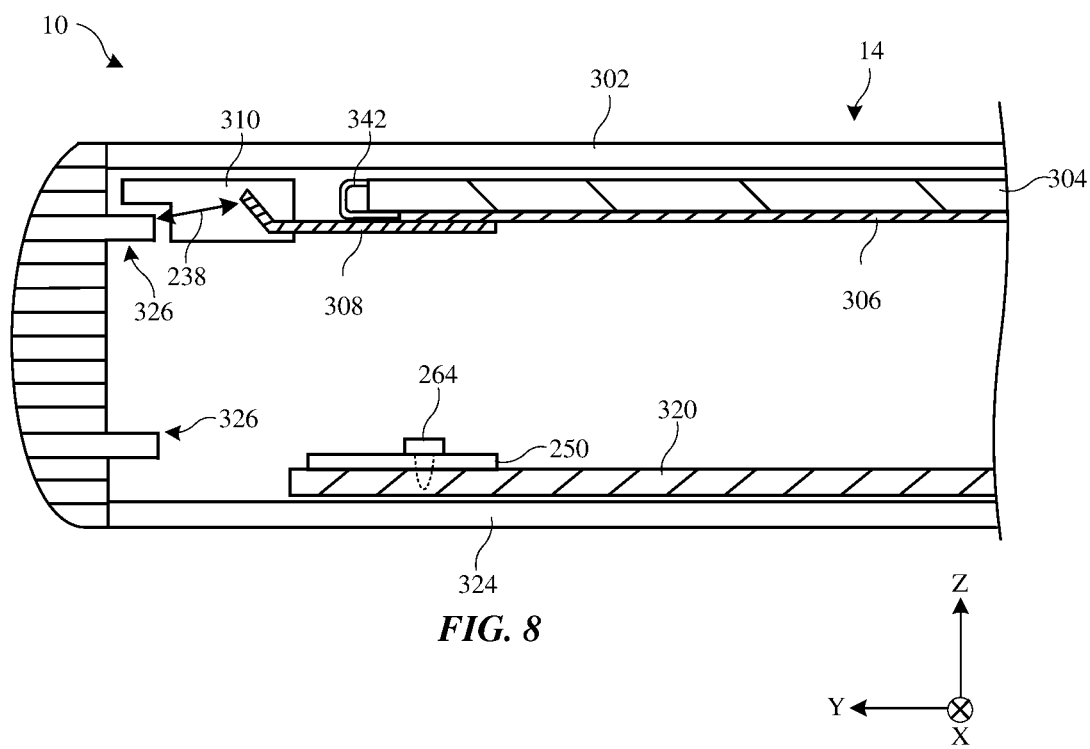

FIGS. 7 and 8 are cross-sectional side views showing how a distributed capacitance of the type shown in FIG. 5 may be formed between display ground structures and an antenna resonating element. FIG. 7 is a cross-sectional side view taken along line 262 in FIG. 5, whereas FIG. 8 is a cross-sectional side view taken along line 268 in FIG. 5. In FIG. 7 (which shows a portion of display ground structures 104 and peripheral conductive structures that is not in the distributed capacitance region), conductive display frame 308 is separated from peripheral conductive housing structures 16 by distance 232. In FIG. 8 (which shows a portion of display ground structures 104 and peripheral conductive structures that is in the distributed capacitance region), conductive display frame 308 is separated from peripheral conductive housing structures 16 by distance 238 that is less than distance 232. FIGS. 7 and 8 show how conductive frame 308 is extended towards the peripheral conductive housing structures 16 in distributed capacitance region 230 (FIG. 5). The portion of display frame 308 that is extended closer to peripheral conductive structures 16 in the distributed capacitance region may sometimes be referred to as a display frame extension or an extended portion of the display frame. The display frame extension and peripheral conductive structures 16 may form a desired distributed capacitance between display ground structures 104 and peripheral conductive housing structures 16.

As shown in FIG. 7, conductive display frame 308 may be electrically connected to a radio-frequency shield 312 by conductive structure 309. Conductive structure 309 may directly contact both the display frame 308 and the radio-frequency shield 312. Conductive structure 309 may be a spring or any other desired structure (e.g., a bracket, clip, spring, pin, screw, solder, weld, conductive adhesive, wire, metal strip, or a combination of these). Alternatively, display frame 308 may directly contact radio-frequency shield 312 without an intervening structure (and conductive structure 309 may be omitted). Fasteners 328 and 330 may attach radio-frequency shield 312 and conductive housing layer 320 together. Fasteners 328 and 330 may be conductive so that they also electrically connect components. For example, fasteners 328 and/or 330 may electrically connect radio-frequency shield 312 to conductive housing layer 320 such that radio-frequency shield 312 forms a portion of the antenna ground. Fastener 330 may be a screw and fastener 328 may be a screw-boss that receives screw 330. However, this example is merely illustrative and in general fasteners 328 and 330 may each be a bracket, clip, spring, pin, screw, solder, weld, conductive adhesive, wire, metal strip, or a combination of these.

Radio-frequency shield 312 may therefore electrically connect different portions of the antenna ground (e.g., radio-frequency shield 312 may electrically connect conductive housing layer 320 to conductive frame 308). Additional components within the electronic device (e.g., adjustable component 202 in FIG. 5) may be coupled to radio-frequency shield 312 if desired.

Radio-frequency shield 312 may also shield components in electronic device 10 from interference. For example, in one illustrative arrangement an additional antenna may be formed underneath radio-frequency shield 312 (e.g., in a cutout region of the antenna ground). Forming an additional antenna underneath radio-frequency shield 312 may result in the additional antenna being shielded from radio-frequency signals generated by other components within electronic device 10 (e.g., radio-frequency signals originating on the other side of the radio-frequency shield).

As shown in FIG. 7, electronic device 10 may also include a flexible printed circuit 342 that conveys signals for display 14. For example, flexible printed circuit 342 may be coupled to a thin-film transistor layer of display panel 304. Flexible printed circuit 342 may also be coupled to an additional flexible printed circuit or a rigid printed circuit board (e.g., a main logic board). Conductive frame 308, plastic frame 310, display panel 304 and/or display plate 306 may accommodate flexible printed circuit 342.

As shown in FIG. 8, a substrate such as printed circuit 250 may also be included in electronic device 10. Printed circuit 250 may be a rigid printed circuit board (e.g., a printed circuit board formed from fiberglass-filled epoxy or other rigid printed circuit board material) or may be a flexible printed circuit (e.g., a flexible printed circuit formed from a sheet of polyimide or other flexible polymer layer). Printed circuit 250 may include antenna traces such as an antenna resonating element, (e.g., for an additional antenna in a cutout region in the antenna ground), transmission line structures (e.g., transmission line structures for transmission line 92 of FIG. 5), surface mount technology components, terminals for an antenna feed (e.g., positive feed terminal 98 or ground feed terminal 100 of FIG. 5), or any other desired traces or components. A conductive fastener such as a screw 264 or another desired conductive structure (e.g., a bracket, clip, spring, pin, screw, solder, weld, conductive adhesive, wire, metal strip, or a combination of these) may electrically connect and/or mechanically secure flexible printed circuit board 250 to conductive housing layer 320. A screw boss or threaded opening in conductive housing layer 320 may receive screw 264. Printed circuit board 250 may be coupled to an additional printed circuit that includes transceiver circuitry (e.g., transceiver circuitry 90 in FIG. 5), if desired.

Figure 9:
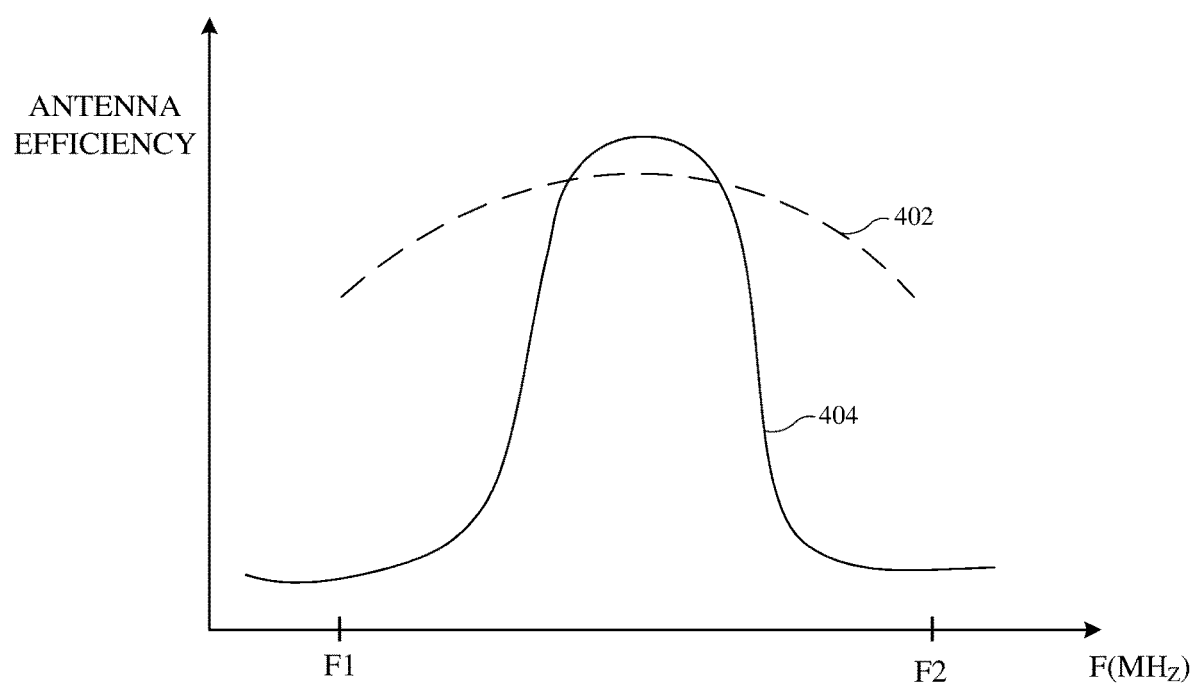
FIG. 9 is a graph of antenna performance (antenna efficiency) as a function of frequency for an antenna of the type shown in FIGS. 5-8 in accordance with an embodiment.

FIG. 9 is a graph of antenna efficiency as a function of frequency for an illustrative antenna of the type shown in FIGS. 5-8. As shown in FIG. 9, antenna 40 (FIG. 5) may exhibit resonances between frequencies $F_1$ and $F_2$. Frequencies $F_1$ and $F_2$ may be any desired frequencies (e.g., 1710 MHz and 2700 MHz). Antenna 40 (FIG. 5) may have an antenna efficiency characterized by curve 402 between frequencies $F_1$ and $F_2$ when there is a distributed capacitance (e.g., in region 230 of FIG. 5) formed between display ground structures 104 (FIG. 5) and peripheral conductive housing structures 16 (FIG. 5). Curve 404 characterizes antenna efficiency in an arrangement where the distributed capacitance region of FIG. 5 is omitted and a surface mount technology capacitor is instead coupled between the peripheral conductive structures and the display ground structures. As shown in FIG. 9, the distributed capacitance formed between display ground structures 104 and peripheral conductive housing structures 16 in FIG. 5 may improve antenna efficiency over a wider range of frequencies than if a discrete surface mount technology capacitor is coupled between the display ground structures and the peripheral conductive housing structures. This example is merely illustrative and, if desired, the curves may have any shapes in any bands. If desired, antenna 40 may exhibit resonances in any desired frequency bands (e.g., a low band from 700 to 960 MHz, a low-midband from 960 to 1710 MHz, a midband from 1710 to 2170 MHz, a high band from 2300 to 2700 MHz, an ultra-high band from 3400 to 3700 MHz, etc.).

The foregoing is merely illustrative and various modifications can be made by those skilled in the art without departing from the scope and spirit of the described embodiments. The foregoing embodiments may be implemented individually or in any combination.

What is claimed is:

1. An electronic device comprising:
 a housing having peripheral conductive structures;
 a display in the housing;
 a conductive frame for the display;
 an antenna resonating element arm for an antenna, wherein the antenna resonating element arm is formed from a segment of the peripheral conductive structures; and
 an antenna ground for the antenna that includes the conductive frame for the display, wherein the conductive frame has a first portion that is separated from the antenna resonating element arm by a first distance and a second portion that is separated from the antenna resonating element arm by a second distance that is less than the first distance and the second portion is configured to form a distributed capacitance with the antenna resonating element arm.

2. The electronic device defined in claim 1, further comprising:
 an antenna feed for the antenna, wherein the antenna feed is coupled between the second portion of the conductive frame and the antenna resonating element arm.

3. The electronic device defined in claim 1, further comprising:
 a conductive display plate that is coupled to the conductive frame, wherein the antenna ground includes the conductive display plate.

4. The electronic device defined in claim 1, wherein the conductive frame has a rectangular periphery with upper and lower edges coupled together by left and right edges and a central opening surrounded by the upper, lower, left, and right edges.

5. The electronic device defined in claim 1, wherein the segment of the peripheral conductive structures is a first segment, the electronic device further comprising:
 a first dielectric-filled gap in the peripheral conductive structures that separates the first segment from a second segment of the peripheral conductive structures; and
 a second dielectric-filled gap in the peripheral conductive structures that separates the first segment from a third segment of the peripheral conductive structures.

6. The electronic device defined in claim 5, wherein the antenna ground comprises the second and third segments of the peripheral conductive structures and a planar conductive layer that extends between the second and third segments of the peripheral conductive structures.

7. The electronic device defined in claim 5, wherein the antenna ground includes a first vertical slot that extends beyond an edge of the first dielectric-filled gap and the first vertical slot has edges defined by the conductive frame and the second segment of the peripheral conductive structures.

8. The electronic device defined in claim 7, wherein the antenna ground includes a second vertical slot that extends beyond an edge of the second dielectric-filled gap and the second vertical slot has edges defined by the conductive frame and the third segment of the peripheral conductive structures.

9. The electronic device defined in claim 1, wherein a dielectric-filled gap is interposed between the antenna resonating element arm and the first and second portions of the conductive frame.

10. An electronic device comprising:
 a housing having peripheral conductive structures;
 a display in the housing;
 a conductive frame for the display;
 an antenna resonating element arm for an antenna, wherein the antenna resonating element arm is formed from a first segment of the peripheral conductive structures;
 a first dielectric-filled gap in the peripheral conductive structures that separates the first segment from a second segment of the peripheral conductive structures;
 a second dielectric-filled gap in the peripheral conductive structures that separates the first segment from a third segment of the peripheral conductive structures;
 a planar conductive layer that extends between the second and third segments;
 an antenna ground for the antenna that includes the conductive frame for the display, the second segment, the third segment, and the planar conductive layer;
 a conductive structure that electrically couples the planar conductive layer to the conductive frame.

11. An electronic device comprising:
a housing having peripheral conductive structures and a planar conductive layer extending between first and second segments of the peripheral conductive structures;
a display in the housing;
a conductive display frame;
a first dielectric-filled gap in the peripheral conductive structures that separates the first segment from a third segment of the peripheral conductive structures;
a second dielectric-filled gap in the peripheral conductive structures that separates the second segment from the third segment;
an antenna resonating element for an antenna formed from at least the third segment of the peripheral conductive structures; and
an antenna ground for the antenna formed from at least the planar conductive layer, the first and second segments of the peripheral conductive structures, and the conductive display frame, wherein the antenna ground includes a first vertical slot that extends beyond an edge of the first dielectric-filled gap and the first vertical slot has edges defined by the conductive display frame and the first segment of the peripheral conductive structures.

12. The electronic device defined in claim 11, wherein a distributed impedance matching capacitance for the antenna is formed by the conductive display frame and the antenna resonating element.

13. The electronic device defined in claim 11, wherein the antenna ground includes a second vertical slot that extends beyond an edge of the second dielectric-filled gap and the second vertical slot has edges defined by the conductive display frame and the second segment of the peripheral conductive structures.

* * * * *